US009482957B1

(12) United States Patent
Lin

(10) Patent No.: US 9,482,957 B1
(45) Date of Patent: Nov. 1, 2016

(54) SOLVENT FOR REDUCING RESIST CONSUMPTION AND METHOD USING SOLVENT FOR REDUCING RESIST CONSUMPTION

(71) Applicant: I-Shan Ke, New Taipei (TW)

(72) Inventor: Yu-Hsun Lin, Taichung (TW)

(73) Assignee: I-Shan Ke, New Taipei (TW)

( * ) Notice: Subject to any disclaimer, the term of this patent is extended or adjusted under 35 U.S.C. 154(b) by 0 days.

(21) Appl. No.: 14/738,946

(22) Filed: Jun. 15, 2015

(51) Int. Cl.
| | |
|---|---|
| G03F 7/40 | (2006.01) |
| C11D 11/00 | (2006.01) |
| G03F 7/42 | (2006.01) |
| B05D 1/00 | (2006.01) |
| H01L 21/02 | (2006.01) |
| G03F 7/16 | (2006.01) |
| C11D 3/20 | (2006.01) |
| C11D 3/22 | (2006.01) |

(52) U.S. Cl.
CPC .............. *G03F 7/422* (2013.01); *B05D 1/005* (2013.01); *C11D 11/0047* (2013.01); *G03F 7/168* (2013.01); *H01L 21/02282* (2013.01); *C11D 3/2068* (2013.01); *C11D 3/226* (2013.01)

(58) Field of Classification Search
CPC ... G03F 7/168; G03F 7/422; C11D 11/0047; C11D 3/266; C11D 3/2068; C11D 3/26; C11D 3/20682; H01L 21/02282
USPC ..................... 430/331; 510/175, 176; 134/1.3
See application file for complete search history.

(56) References Cited

U.S. PATENT DOCUMENTS

| | | | | |
|---|---|---|---|---|
| 5,066,616 A * | 11/1991 | Gordon | ................... | G03F 7/162 148/DIG. 137 |
| 5,271,775 A * | 12/1993 | Asano | ...................... | C11D 3/43 134/40 |
| 5,942,035 A * | 8/1999 | Hasebe | ................... | B05C 11/08 118/302 |
| 6,391,800 B1 * | 5/2002 | Redd | ......................... | G03F 7/16 257/E21.027 |
| 6,461,983 B1 * | 10/2002 | Davlin | .................. | H01L 21/312 257/E21.259 |
| 6,589,719 B1 * | 7/2003 | Ahn | ........................ | G03F 7/422 430/329 |
| 6,641,986 B1 * | 11/2003 | Zhang | ................ | B01F 17/0021 430/271.1 |
| 6,682,876 B2 * | 1/2004 | Ahn | ........................ | G03F 7/168 430/327 |
| 7,063,930 B2 * | 6/2006 | Chai | ........................ | C11D 1/83 430/256 |
| 7,129,199 B2 * | 10/2006 | Zhang | ................... | G03F 7/0048 510/175 |
| 7,335,319 B2 * | 2/2008 | Peterson | .............. | C11D 7/5022 252/364 |
| 7,387,988 B2 * | 6/2008 | Ahn | ..................... | C11D 11/0047 134/1.3 |
| 8,227,182 B2 * | 7/2012 | Lee | ......................... | G03F 7/168 430/270.1 |
| 8,563,230 B2 * | 10/2013 | Inatomi | ..................... | G03F 7/40 216/41 |
| 8,614,053 B2 * | 12/2013 | Quillen | ................... | G03F 7/426 430/311 |
| 2003/0113673 A1 * | 6/2003 | Ahn | ........................ | G03F 7/168 430/331 |
| 2005/0194661 A1 * | 9/2005 | Whitman | .............. | H01L 21/312 257/640 |
| 2006/0240358 A1 * | 10/2006 | Powell | ...................... | G03F 7/16 430/311 |
| 2010/0097587 A1 * | 4/2010 | Petrus De Jong | .. | G03F 7/70341 355/30 |
| 2010/0227056 A1 * | 9/2010 | Takayanagi | ....... | H01L 21/67051 427/240 |

* cited by examiner

*Primary Examiner* — Amanda C Walke
(74) *Attorney, Agent, or Firm* — CKC & Partners Co., Ltd.

(57) ABSTRACT

The present disclosure provides a solvent for reducing resist consumption, which includes a first solvent selected from the group consisting of alkylene glycol alkyl ether acetate, alkylene glycol alkyl ether and a combination thereof, and a second solvent having a hydrogen bonding Hansen parameter lower than 5.34 and an evaporation rate (n-BuAc=1) lower than 0.6. A volume ratio of the first solvent to the second solvent is in a range of 0/100 to 90/10. A resist dispense volume for a 300 mm wafer is less than 0.6 cc, or a resist dispense volume for a 450 mm wafer is less than 1.1 cc.

13 Claims, 1 Drawing Sheet

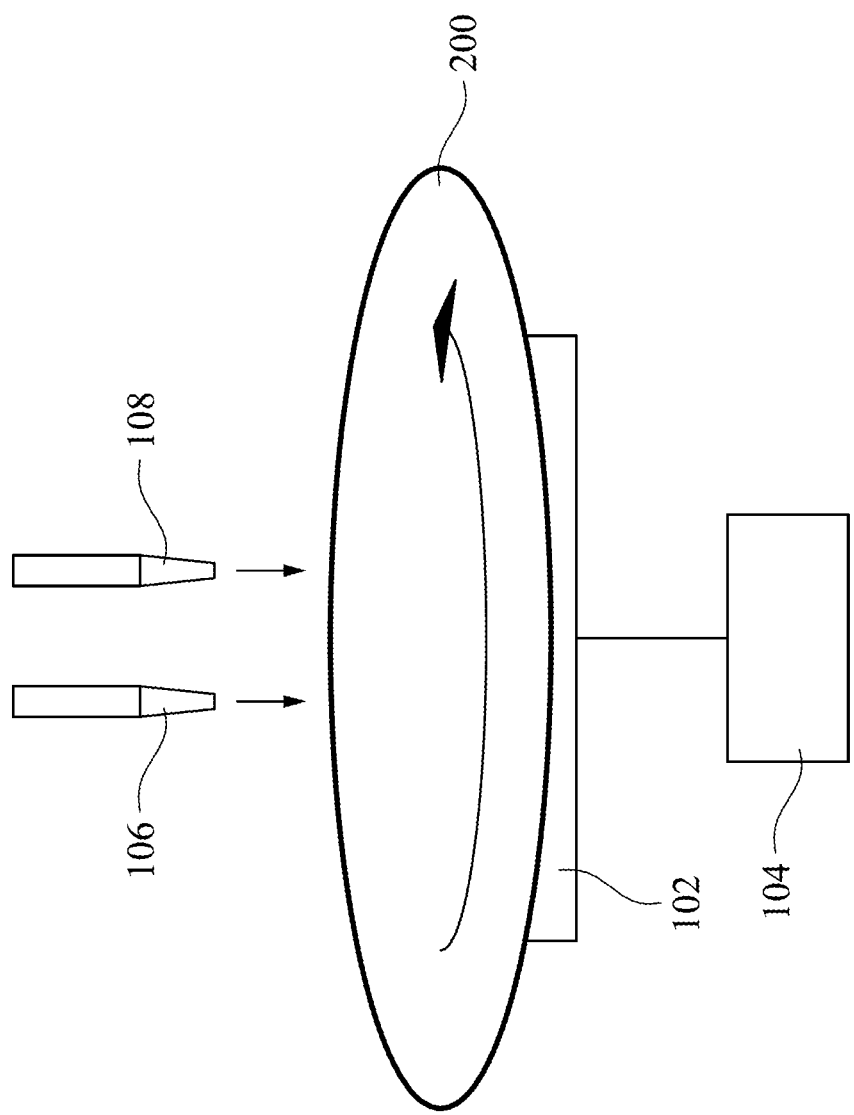

_(12) United States Patent_
SOLVENT FOR REDUCING RESIST CONSUMPTION AND METHOD USING SOLVENT FOR REDUCING RESIST CONSUMPTION

BACKGROUND

1. Field of Invention

The present disclosure relates to a solvent for coating thickness uniformity improvement and reducing resist consumption and a method using the solvent for reducing resist consumption.

2. Description of Related Art

In spin coating technology, to dispense a rinse solvent before coating a main coating material is popular in order to reduce the main coating material dispense amount. For example, in a resist coating process, the resist dispense amount can be reduced if a solvent as a lubricant is dispensed on a semiconductor wafer before the resist is coated. The solvent dispensed before the resist is coated is called as "reducing resist consumption (RRC)" solvent.

However, there is still a need for an improved solvent to further reduce the main coating material (e.g., resist) dispense amount, to further improve the coating thickness uniformity and thus to reduce the material consumption cost, improve the coating performance and protect the environment.

SUMMARY

The present disclosure provides a solvent for reducing resist consumption, which includes a first solvent selected from the group consisting of alkylene glycol alkyl ether acetate, alkylene glycol alkyl ether and a combination thereof, and a second solvent having a hydrogen bonding Hansen parameter lower than 5.34 and an evaporation rate (n-BuAc=1) lower than 0.6. A volume ratio of the first solvent to the second solvent is in a range of 0/100 to 90/10. A resist dispense volume (or called as resist coating volume) for a 300 mm wafer is less than 0.6 cc, or a resist dispense volume for a 450 mm wafer is less than 1.1 cc.

According to various embodiments of the present disclosure, the hydrogen bonding Hansen parameter of the second solvent is lower than or equal to 4.3.

According to various embodiments of the present disclosure, the evaporation rate (n-BuAc=1) of the second solvent is lower than or equal to 0.5.

According to various embodiments of the present disclosure, the alkylene glycol alkyl ether acetate is propylene glycol methyl ether acetate (PGMEA), ethylene glycol butyl ether acetate, diethylene glycol ethyl ether aetate or diethylene glycol butyl ether acetate.

According to various embodiments of the present disclosure, the alkylene glycol alkyl ether is propylene glycol methyl ether (PGME), ethylene glycol butyl ether, propylene glycol tertiary butyl ether, propylene glycol n-propyl ether, ethylene glycol propyl ether, dipropylene glycol methyl ether, diethylene glycol methyl ether, diethylene glycol ethyl ether, diethylene glycol propyl ether, ethylene glycol hexyl ether, dipropylene glycol n-butyl ether, ethylene glycol 2-ethylhexyl ether, propylene glycol phenyl ether, propylene glycol n-propyl ether or diethylene glycol butyl ether.

According to various embodiments of the present disclosure, the second solvent is selected from the group consisting of n-butyl propionate, methyl n-amyl ketone, methyl iso-amyl ketone, γ-butyrolactone (GBL), 2-ethylhexyl acetate, n-methyl-2-pyrrolidone (NMP), diisobutyl ketone, cyclohexanone, cyclohexanol, isobutyl isobutyrate, ethyl 3-ethoxypropionate, n-pentyl propionate and a combination thereof.

According to various embodiments of the present disclosure, the second solvent is selected from the group consisting of p-amyl acetate, dimethylformamide, oxo-hexyl acetate esters, diacetone alcohol, oxo-heptyl acetate esters, oxo-octyl acetate esters, isophorone, ethylene glycol diacetate, dibasic esters, texanol ester alcohol, methyl isobutyl carbinol, p-amyl alcohol, 2-ethylhexanol, methoxy propyl aetate, methyl glycol, ethyl glycol, isopropyl glycol, n-butyl glycol, ethoxy propanol, diacetone alcohol, methyl amyl acetate, dimethyl dipate, di-n-butyl ether, methyl oleate and a combination thereof.

According to various embodiments of the present disclosure, the second solvent has an evaporation rate (diethyl ether=1) greater than 21.2.

According to various embodiments of the present disclosure, the second solvent has an evaporation rate (diethyl ether=1) greater than or equal to 24.

According to various embodiments of the present disclosure, the volume ratio of the first solvent to the second solvent is in a range of 10/90 to 90/10.

According to various embodiments of the present disclosure, the solvent further includes an additive having a polar group and a non-polar group, in which the polar group includes —OH, —NH$_2$, —COON, —SO$_3$ or a combination thereof, and the non-polar group is linear, cyclic, or branch structure of alkyl or fluroalkyl group, and the additive is in a range form 0.01 wt % to 10 wt % based on the total weight of the first solvent and the second solvent.

According to various embodiments of the present disclosure, the volume ratio of the first solvent to the second solvent is in a range of 40/60 to 80/20.

The present disclosure further provides a method for reducing resist consumption, which includes: coating a solvent mentioned above over a substrate to form a solvent film; and forming a resist film over the solvent film.

It is to be understood that both the foregoing general description and the following detailed description are by examples, and are intended to provide further explanation of the present disclosure as claimed.

BRIEF DESCRIPTION OF THE DRAWINGS

The present disclosure can be more fully understood by reading the following detailed description of the embodiment, with reference made to the accompanying drawings as follows:

FIG. 1 is a schematic view of a spin coater according some embodiments of the present disclosure.

DETAILED DESCRIPTION

The present disclosure is described by the following specific embodiments. Those with ordinary skill in the arts can readily understand the other advantages and functions of the present invention after reading the disclosure of this specification. The present disclosure can also be implemented with different embodiments. Various details described in this specification can be modified based on different viewpoints and applications without departing from the scope of the present disclosure.

The singular forms "a," "an" and "the" used herein include plural referents unless the context clearly dictates otherwise. Reference throughout this specification to "one embodiment" means that a particular feature, structure, or characteristic described in connection with the embodiment is included in at least one embodiment of the present disclosure. Therefore, the appearances of the phrases "in one embodiment" or "in an embodiment" in various places throughout this specification are not necessarily all referring to the same embodiment. Further, the particular features, structures, or characteristics may be combined in any suitable manner in one or more embodiments. It should be appreciated that the following figures are not drawn to scale; rather, the figures are intended; rather, these figures are intended for illustration.

The resist material is introduced below in detail. In some embodiments, the resist material includes a BARC or trilayer underlayer. In some embodiments, each of the BARC and the trilayer underlayer includes organic polymer and cross liner that will crosslink after baking for forming a second film thereon. In some embodiments, the resist material includes a trilayer middle layer, which may include inorganic silicon containing polymer. The inorganic silicon containing polymer will crosslink after baking for forming another coating material over it thereover.

In a semiconductor trilayer process, the organic underlayer is firstly coated over the wafer. The middle layer (e.g., inorganic middle layer) is then formed over the organic underlayer. An image photosensitive resist layer is then formed over the middle layer. After the image photosensitive resist material is coated, an exposure step is performed after baking the wafer. After the exposure step, the wafer is transferred to another post exposure baking (PEB) unit for chemical amplify reaction (CAR) proceeding. After the PEB process is completed, the wafer may be transferred to a developer unit for final photoresist pattern achievement. The exposure tool may use the energy source from KrF, ArF, EUV, or e-beam.

The photoresist is used to transfer the pattern from a photo mask through the exposure of excited energy from KrF, ArF, EUV, or e-beam energy source. After exposure, the photoresist ingredients absorb the energy and transfer the photo acid generator (PAG) into acid in chemical amply reaction (CAR) resist system. The acid will decompose the acid labile group in polymer to switch the polymer from hydrophobic to hydrophilic in post exposure baking (PEB) step. After PEB, the wafer is transferred to the developer unit for final resist pattern developing. If the developer is a base solution, for example, 2.38% TMAH aqueous solution, the polymer of the exposed area will become polar and soluble to aqueous solution. If the developer is a solvent base solution, for example, n-butyl acetate (NBA) solvent, the polymer of the non-exposed area will be dissolved in the NBA solvent and the polymer of the exposed/polar area is remained. This kind of developer is called negative tone developer (NTD) process, which is different from the conventional positive tone developer (PTD) using the TMAH aqueous solution.

In order to get enough resist pattern fidelity, there is a need for an effective depth of focus (DOE) for exposure. The DOF will be decreased if the substrate topography has various height levels, or the resist film has poor thickness uniformity. That is why the resist coating is required to have good thickness uniformity on the whole wafer. For example, the resist film thickness variation is defined as target thickness +/−3% or even lower. If the resist film is BARC, ML or UL, the resist film thickness variation is a key for reflectivity control. If the reflectivity is different, the image photoresist layer will have different CD value.

Accordingly, it is important to coat the resist material on the substrate with good thickness uniformity. There are many methods to achieve the purpose. Normally, if the resist material dispense volume is increased, the whole wafer resist film thickness uniformity will be improved. Nevertheless, the increased resist dispense volume will increase material cost and the production waste since most of the resist will be spun away from the wafer. In order to effective reduce the resist dispense volume, a reducing resist consumption (RRC) solvent is used to reduce the resist dispense amount. The RRC solvent may typically be PGME/PGMEA=70/30, which is also called as OK73. The OK73 is widely used in I line, KrF, ArF, to EUV for resist RRC use, EBR front side remove, EBR backside rinse, and resist strip.

However, the general RRC solvent, such as OK73, has the issues below. There is a need for an enough high amount of the RRC solvent to keep a high loading remain on the semiconductor wafer, and thus to ensure the resist is uniformly coated and the resist dispense amount is significantly reduced. However, the enough high amount of the RRC solvent may influence the resist ingredient composition. For example, the resist mixed with the RRC solvent at different positions (e.g., wafer center and wafer edge) may have various mix ratios, resulting in different resist performance at different positions respectively.

Furthermore, the general RRC solvent is easily evaporated, and thus the RRC solvent at wafer edge may be less than that at wafer center, resulting in poor smooth/lubricant functions. A resist poor coating issue, such as broken, bubble coating or coating with non-uniform thickness, may also occur at the wafer edge due to the insufficient RRC solvent. This problem become even worse in 450 mm wafer coating process. Accordingly, the amount of the RRC solvent cannot be reduced due to the requirement of the coating uniformity. Another way to keep more solvent on wafer edge area is to decrease the interval time/delay time between dispensing the RRC solvent and the resist, but it will increase a remained amount of the RRC solvent on the wafer surface. Too much remained RRC solvent will hybrid with the resist and change the resist performance. Therefore, the resist dispense volume is typically in a range of about 1.5 to about 0.8 cc. If the resist dispense volume is significantly lower than 0.8 cc, the thickness variation issues and coating difficulties mentioned above will occur.

Given the above, there is still a need for an improved RRC solvent to further reduce the main coating material (e.g., resist) dispense amount but still maintain good resist film thickness uniformity, and thus to reduce the material consumption cost and protect the environment.

One way to solve this issue is to change the evaporation rate of the RRC solvent, and thus to improve wettability between the resist and the surface of the substrate. When the RRC evaporation rate is reduced, it can keep high loading amount at the edge area of the wafer, which offers effective lubricant priming effect for the resist material and thus reduces the coating material amount. The RRC solvent at the edge area of the wafer may let the resist material still prime at the edge area.

Another way to solve this issue is to reduce the interaction force (e.g., hydrogen bond) of the RRC solvent, and thus to reduce the interface friction force and improve final coating thickness uniformity.

Another way to reduce the interaction force of the RRC solvent and thus to improve the interface lubricant property is to add an additive into the RRC solvent. The additive contains a non-polar group for orienting on the substrate surface as a lubricant buffer layer and a polar group for substrate adhesion improvement.

According to the ways, the present disclosure provides a solvent for reducing resist consumption, which includes a first solvent selected from the group consisting of alkylene glycol alkyl ether acetate, alkylene glycol alkyl ether and a combination thereof, and a second solvent having a hydrogen bonding Hansen parameter lower than 5.34 and an evaporation rate (n-BuAc=1) lower than 0.6. A volume ratio of the first solvent to the second solvent is in a range of 0/100 to 90/10.

In some embodiments, the hydrogen bonding Hansen parameter of the second solvent is lower than or equal to 4.3. In some embodiments, the evaporation rate (n-BuAc=1) of the second solvent is lower than or equal to 0.5.

In some embodiments, the alkylene glycol alkyl ether acetate is propylene glycol methyl ether acetate (PGMEA), ethylene glycol butyl ether acetate, diethylene glycol ethyl ether aetate or diethylene glycol butyl ether acetate.

In some embodiments, the alkylene glycol alkyl ether is propylene glycol methyl ether (PGME), ethylene glycol butyl ether, propylene glycol tertiary butyl ether, propylene glycol n-propyl ether, ethylene glycol propyl ether, dipropylene glycol methyl ether, diethylene glycol methyl ether, diethylene glycol ethyl ether, diethylene glycol propyl ether, ethylene glycol hexyl ether, dipropylene glycol n-butyl ether, ethylene glycol 2-ethylhexyl ether, propylene glycol phenyl ether, propylene glycol n-propyl ether or diethylene glycol butyl ether.

In some embodiments, the second solvent is selected from the group consisting of n-butyl propionate, methyl n-amyl ketone, methyl iso-amyl ketone, γ-butyrolactone (GBL), 2-ethylhexyl acetate, n-methyl-2-pyrrolidone (NMP), diisobutyl ketone, cyclohexanone, cyclohexanol, isobutyl isobutyrate, ethyl 3-ethoxypropionate, n-pentyl propionate and a combination thereof.

In some embodiments, the second solvent is selected from the group consisting of p-amyl acetate, dimethylformamide, oxo-hexyl acetate esters, diacetone alcohol, oxo-heptyl acetate esters, oxo-octyl acetate esters, isophorone, ethylene glycol diacetate, dibasic esters, texanol ester alcohol, methyl isobutyl carbinol, p-amyl alcohol, 2-ethylhexanol, methoxy propyl aetate, methyl glycol, ethyl glycol, isopropyl glycol, n-butyl glycol, ethoxy propanol, diacetone alcohol, methyl amyl acetate, dimethyl dipate, di-n-butyl ether, methyl oleate and a combination thereof.

In some embodiments, the second solvent has an evaporation rate (diethyl ether=1) greater than 21.2. In some embodiments, the second solvent has an evaporation rate (diethyl ether=1) greater than or equal to 24.

In some embodiments, the volume ratio of the first solvent to the second solvent is in a range of 10/90 to 90/10. In some embodiments, the volume ratio of the first solvent to the second solvent is in a range of 40/60 to 80/20.

In some embodiments, after the solvent of the present disclosure is applied (or coated) on a 300 mm wafer, a resist has a resist dispense volume less than 0.6 cc, or even less than 0.5 cc, 0.4 cc, 0.3 cc or 0.2 cc. In some embodiments, after the solvent of the present disclosure is applied (or coated) on a 450 mm wafer, a resist has a resist dispense volume less than 1.1 cc, or even less than 1.0 cc, 0.9 cc, 0.8 cc or 0.7 cc.

It is noteworthy that the cost of the first solvent (about 2-3 US/liter) is lower than the cost of the second solvent (greater than 5 US/liter), and thus the solvent including the first and second solvents may be used to save cost.

In some embodiments, the RRC solvent further includes an additive. The additive may contain a polar group and a non-polar group. The polar group may include oxygen, nitrogen, or sulfide atom. For example, the polar group may include —OH, —NH$_2$, —COOH, —SO$_3$, any other suitable terminal structure or a combination thereof. The non-polar group may include linear, cyclic, or branch structure of alkyl, or fluroalkyl group. For example, the additive may include RfSO$_2$NH$_2$ structure. In some embodiments, the Rf is C$_4$F$_9$. In another embodiment, the additive is C$_4$F$_9$SO$_2$NHCH$_2$CH$_2$OH or C$_4$F$_9$SO$_2$N(CH$_2$CH$_2$OH)$_2$. In another embodiment, the additive has structure of C$_6$F$_{13}$CH$_2$OH, C$_6$F$_{13}$CH$_2$OCH$_2$CH$_2$OH, C$_6$F$_{13}$CH$_2$O(CH$_2$CH$_2$O)$_2$H. In another embodiment, the additive has structure of C$_n$H$_{2n+1}$OH, C$_n$H$_{2n+1}$COOH, where the n=1 to 5. In another embodiment, the additive has structure of

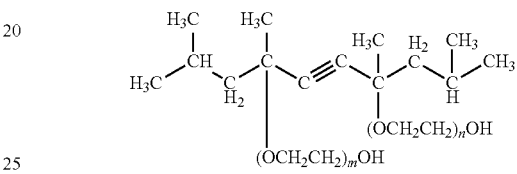

wherein m is range from 0 to 5. In another embodiment, the additive is an acrylate or methacrylate copolymer, which includes alkyl, fluoroalkyl, or benzyl group monomer unit and amine, hydroxyl, carboxylic contained monomer. In one embodiment, the polymer additive has structure of —(CH$_2$CHCOOH)— monomer unit and —(CH$_2$CH$_2$COOCH$_3$CF$_3$)— monomer unit. The weight percent loading of the additive is range from 0.01 wt % to 10 wt % based on the total weight of the first solvent and the second solvent.

The present disclosure further provides a method for reducing resist consumption, which includes: coating a solvent mentioned above over a substrate to form a solvent film; and forming a resist film over the solvent film. In some embodiments, forming the resist film has a resist dispense amount with a lower limit of about 0.2 cc. In another embodiment, forming the resist film has a dispense amount with a lower limit of about 0.2 cc in 300 mm wafer. In another embodiment, forming the resist film has a dispense amount with a lower limit of about 0.8 cc in 450 mm wafer. In another embodiment, forming the resist film has a dispense amount with a safety thickness window of about 0.5 cc in 300 mm wafer and 1.0 cc in 450 mm wafer.

FIG. 1 is a schematic view of a spin coater according some embodiments of the present disclosure. As shown in FIG. 1, in the coating process, a substrate 200 is transferred to a spin coater 100. The spin coater 100 includes a spin chuck 102 configured to hold the substrate 200 through vacuum. The spin chuck 102 is connected to a motor 104, which is configured to offer a rotation movement speed to the substrate 200. The rotation speed may be ranging from 0 rpm to 3000 rpm, and the rotation time may be ranging from 0 sec to any time depends on the coating recipe setting. After the substrate 200 is fixed by the spin chuck 102, the RRC solvent is dispensed on a central area of the substrate 200 through a nozzle 106, and a dispense arm is positioned over the central area or has offset to the central area. The dispense arm may be fixed or dynamic swung when the RRC solvent is dispensed, the off set range or the dynamic swing range is substantially from the central area of the substrate to an edge area of the substrate and depends on the recipe setting and purpose.

After the RRC solvent is dispensed, a coating material may be dispensed over the substrate 200 through another nozzle 108. The interval time between the RRC solvent and coating material may be ranging from 0 second to few seconds that depend on the recipe setting. During the interval time, the motor 104 may be static or keep spin that depends on the purpose and recipe setting. The nozzle 108 may be located at the central area of the substrate 200 or has offset to the central area. When the coating material is coated, the motor 104 may be spun or static that depends on the recipe setting. The rotation speed may be ranging from 0 to 3000 rpm. Normally, in order to keep better coating thickness uniformity, the rotation speed is kept between 1000 rpm and 2000 rpm. In some embodiments, the rotation speed is kept at 1500 rpm as a main speed. The rotation time is about 10 to 30 sec. In some embodiments, the substrate 200 is a mask substrate for semiconductor lithography use. It may also be a semiconductor wafer, a LED, a LCD, or a solar cell substrate.

In a semiconductor lithography resist coating process, a wafer 200 is transferred to the spin coater 100. In some embodiments, the wafer 200 is an eight inches, twelve inches, or fifteen inches wafer. In some embodiments, the spin coater 100 is one of the Track chamber from TEL or Sokudo Equipment Company. The spin coater 100 includes the spin chuck 102 configured to hold the wafer through vacuum. The spin chuck 102 is connected to the motor 104 and configured to offer a rotation movement speed to the wafer 200. The rotation speed may be ranging from 0 rpm to 3000 rpm, and the rotation time may be ranging from 0 sec to any time depends on the coating recipe setting. After the wafer 200 is fixed by the spin chuck 102, the RRC solvent is dispensed on the central area of the wafer 200, and the dispense arm may be positioned over the central area of the wafer 200 or has offset to the central area. The dispense arm may be fixed or dynamic swung when the RRC solvent is dispensed, the off set range or the dynamic swing range is substantially from the central area to an edge area of the wafer 200 and depends on the recipe setting and purpose.

After the RRC solvent is dispensed, a resist material may be dispensed over the wafer 200. The resist material may be organic KrF, ArF, EUV, e-beam resist, or trilayer underlayer. The resist material may be inorganic trilayer middle layer, SOG, spin on low k material. The interval time between the RRC solvent and the resist material may be ranging from 0 second to few seconds that depend on the recipe setting. During the interval time, the motor 104 may be static or keep spin that depends on the purpose and recipe setting. The resist material is dispensed through the nozzle 108 over top of the wafer 200, and the nozzle 108 may be located at the central area of the wafer or has offset to the central area. When the resist material is coated, the motor 104 may be spun or static that depends on the recipe setting. The rotation speed may be ranging from 0 to 3000 rpm. Normally, in order to keep better coating thickness uniformity, the rotation speed is kept between 1000 rpm and 2000 rpm. In some embodiments, the rotation speed is kept at 1500 rpm as a main speed. The rotation time is about 10 to 30 sec. In some embodiments, the rotation time is about 1 to 5 second. After the rotation with the main speed is performed, another rotation with different spin speed and spin time is performed to achieve better coating thickness uniformity.

The solvent can also be used to remove edge-bead residue at front side or backside of the wafer, and such removing process is called as edge bead removal (EBR) process. For example, a resist film is formed over a substrate, which is positioned over a spin rotator. The substrate is rotated using the spin rotator, and a solvent is sprayed on an edge of the substrate. The solvent includes a first solvent selected from the group consisting of alkylene glycol alkyl ether acetate, alkylene glycol alkyl ether and a combination thereof; and a second solvent having a hydrogen bonding Hansen parameter lower than 5.34 and an evaporation rate (n-BuAc=1) lower than 0.6, in which a volume ratio of the first solvent to the second solvent is in a range of 0/100 to 90/10. Other features may refer to the embodiments mentioned above.

The solvent may further include an additive that contain at least on polar group for substrate adhesion and non-polar group for surface lubricant. The solvent may selected from the group consisting of alkylene glycol alkyl ether acetate, alkylene glycol alkyl ether and a combination thereof; The solvent may further contain a second solvent having a hydrogen bonding Hansen parameter lower than 5.34 and an evaporation rate (n-BuAc=1) lower than 0.6, in which a volume ratio of the first solvent to the second solvent is in a range of 0/100 to 100/0. The additive loading may range from 0.01 wt % to 10 wt % based on the total weight of the first solvent and the second solvent. Other features may refer to the embodiments mentioned above.

In addition, the RRC solvent exhibits good solubility to the resist, and thus can be used to remove (or called as strip) the resist after the resist is coated or etched. The RRC solvent can also be used as a cleaning solvent before the resist is coated to remove impurities or defects.

EXAMPLES

The following Examples are provided to illustrate certain aspects of the present disclosure and to aid those of skill in the art in practicing this disclosure. These Examples are in no way to be considered to limit the scope of the disclosure in any manner.

Table 1 shows test results of using different RRC solvents. For the evaporation rate, the n-BuAc refers to n-butyl acetate (or called as NBA). The n-BuAc is defined as 1, and the other higher evaporation solvents are multiple of this rate. If the reference is ether=1, the slower evaporation solvent are multiple of this rate. The H bond strength is defined by Hansen solubility parameter, in which the parameter is estimated by Dr. Charles Hansen shown as $(cal/cm^3)^{1/2}$.

The resist dispense volume is defined as the minimum coating volume without obvious poor coating at wafer edge and meet the whole wafer thickness uniformity +/−3%. For example, if the target thickness is 50 nm, the thickness target range is +/−1.5 nm. If the target thickness is 200 nm, the thickness target range is +/−6 nm. For convenience, the coating material dispense volume is normalized as 1 of OK73 and the other dispense volume by different RRC solvent are multiple of this rate. The dispense volume of the coating material for an image resist layer, BARC, ML, or UL has similar trend.

TABLE 1

| | RRC Solvent | Evaporation Rate NBuAc = 1 | Evaporation Rate Diethyl ether = 1 | Hydrogen bonding Hansen Parameter | Reisist Dispense Volume OK73 = 1 |
|---|---|---|---|---|---|
| Comparataive Example 1 | Acetone | 6.3 | 1.9 | 3.4 | 1.8 |
| Comparataive Example 2 | Methyl ethyl ketone | 3.8 | 3.2 | 2.5 | 1.5 |
| Comparataive Example 3 | isobutanol | 0.6 | 20.2 | 7.8 | 1.2 |
| Comparataive Example 4 | OK73 | 0.6 | 21.2 | 5.34 | 1.0 |
| Example 1 | n-butyl propionate | 0.5 | 2.2 | 3.3 | 0.9 |
| Example 2 | methyl n-amyl ketone | 0.4 | 30 | 2 | 0.8 |
| Example 3 | methyl iso-amyl ketone | 0.5 | 24 | 2 | 0.7 |
| Example 4 | γ-butyrolactone | 0.03 | 40 | 3.5 | 0.7 |
| Example 5 | 2-ethylhexyl acetate | 0.04 | 403.4 | 2.5 | 0.7 |
| Example 6 | n-methyl-2-pyrrolidone | 0.04 | 302.5 | 3.5 | 0.7 |
| Example 7 | ethylene glycol butyl ether acetate | 0.03 | 403.1 | 4.3 | 0.8 |
| Example 8 | ethylene glycol butyl ether | 0.09 | 136 | 6 | 0.9 |
| Example 9 | diisobutyl ketone | 0.2 | 60.5 | 2 | |
| Example 10 | cyclohexanone | 0.3 | 40.3 | 2.5 | 0.7 |
| Example 11 | cyclohexanol | 0.05 | 242 | 6.6 | 0.9 |
| Example 12 | isobutyl isobutyrate | 0.4 | 30.2 | 2.9 | 0.8 |
| Example 13 | ethyl 3-ethoxy-propionate | 0.12 | 100.8 | 4.3 | 0.7 |
| Example 14 | n-pentyl propionate | 0.2 | 60.5 | 3.2 | 0.7 |
| Example 15 | PGMEA/cyclohexanone = 50/50 | 0.35 | 35 | 3.6 | 0.7 |
| Example 16 | PGMEA/cyclohexanone = 60/40 | 0.36 | 34.2 | 3.8 | 0.7 |
| Example 17 | PGMEA/cyclohexanone = 80/20 | 0.38 | 32.16 | 4.3 | 0.8 |

As shown in Table 1, if the RRC solvent has lower evaporation rate than OK73, it has lower dispense volume for the coating material than that of OK73. That is, the evaporation rate of the RRC solvent indeed is a major factor for controlling the coating dispense volume. The hydrogen bonding Hansen parameter also influences the coating thickness uniformity. If the hydrogen bonding Hansen parameter is high, the thickness uniformity may become poor. Basically, the RRC solvent should have lower hydrogen bonding Hansen parameter than that of OK73 to achieve better thickness uniformity control.

It will be apparent to those skilled in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:

1. A solvent for reducing solvent evaporation and surface interaction for semiconductor resist coating, consisting of:
   a first solvent, selected from the group consisting of alkylene glycol alkyl ether acetate, alkylene glycol alkyl ether and a combination thereof; and
   a second solvent, selected from the group consisting of n-butyl propionate, methyl n-amyl ketone, methyl iso-amyl ketone, 2-ethylhexyl acetate, n-methyl-2-pyrrolidone (NMP), diisobutyl ketone, cyclohexanone, cyclohexanol, isobutyl isobutyrate, n-pentyl propionate, p-amyl acetate, dimethylformamide, oxo-hexyl acetate esters, diacetone alcohol, oxo-heptyl acetate esters, oxo-octyl acetate esters, isophorone, ethylene glycol diacetate, dibasic esters, texanol ester alcohol, methyl isobutyl carbinol, p-amyl alcohol, 2-ethylhexanol, methoxy propyl aetate, methyl glycol, ethyl glycol, isopropyl glycol, n-butyl glycol, ethoxy propanol, diacetone alcohol, methyl amyl acetate, dimethyl dipate, di-n-butyl ether, methyl oleate and a combination there,
   wherein a volume ratio of the first solvent to the second solvent is in a range of 0/100 to 90/10,
   wherein a resist dispense volume for a 300 mm wafer is less than 0.6 cc, or a resist dispense volume for a 450 mm wafer is less than 1.1 cc.

2. The solvent of claim 1, wherein the hydrogen bonding Hansen parameter of the second solvent is lower than or equal to 4.3.

3. The solvent of claim 1, wherein the evaporation rate (n-BuAc=1) of the second solvent is lower than or equal to 0.5.

4. The solvent of claim 1, wherein the alkylene glycol alkyl ether acetate is propylene glycol methyl ether acetate (PGMEA), ethylene glycol butyl ether acetate, diethylene glycol ethyl ether aetate or diethylene glycol butyl ether acetate.

5. The solvent of claim 1, wherein the alkylene glycol alkyl ether is propylene glycol methyl ether (PGME), ethylene glycol butyl ether, propylene glycol tertiary butyl ether, propylene glycol n-propyl ether, ethylene glycol propyl ether, dipropylene glycol methyl ether, diethylene glycol methyl ether, diethylene glycol ethyl ether, diethylene glycol propyl ether, ethylene glycol hexyl ether, dipropylene glycol n-butyl ether, ethylene glycol 2-ethylhexyl ether, propylene glycol phenyl ether, propylene glycol n-propyl ether or diethylene glycol butyl ether.

6. The solvent of claim 1, wherein the second solvent has an evaporation rate (diethyl ether=1) greater than 21.2.

7. The solvent of claim 1, wherein the second solvent has an evaporation rate (diethyl ether=1) greater than or equal to 24.

8. The solvent of claim 1, wherein the volume ratio of the first solvent to the second solvent is in a range of 10/90 to 90/10.

9. The solvent of claim 1, wherein the volume ratio of the first solvent to the second solvent is in a range of 40/60 to 80/20.

10. The solvent of claim 1, wherein the first solvent is PGMEA, and the second solvent is cyclohexanone.

11. The solvent of claim 10, wherein the volume ratio of the first solvent to the second solvent is in a range of 40/60 to 80/20.

12. The solvent of claim 1, further comprising an additive having a polar group and a non-polar group, wherein the polar group includes —OH, —NH$_2$, —COOH, —SO$_3$ or a combination thereof, and the non-polar group is linear, cyclic, or branch structure of alkyl or fluroalkyl group, and the additive is in a range form 0.01 wt % to 10 wt % based on the total weight of the first solvent and the second solvent.

13. A method for reducing resist consumption, comprising:
   coating a solvent of claim 1 over a substrate to form a solvent film; and
   forming a resist film over the solvent film.

\* \* \* \* \*